US012787607B2

(12) United States Patent
Park

(10) Patent No.: US 12,787,607 B2
(45) Date of Patent: Nov. 3, 2026

(54) DISPLAY DEVICE

(71) Applicant: LG Display Co., Ltd., Seoul (KR)

(72) Inventor: JoonWon Park, Seoul (KR)

(73) Assignee: LG Display Co., Ltd. (KR)

( * ) Notice: Subject to any disclaimer, the term of this patent is extended or adjusted under 35 U.S.C. 154(b) by 320 days.

(21) Appl. No.: 18/395,804

(22) Filed: Dec. 26, 2023

(65) Prior Publication Data

US 2024/0224724 A1 Jul. 4, 2024

(30) Foreign Application Priority Data

Dec. 30, 2022 (KR) ........................ 10-2022-0190724

(51) Int. Cl.
*H10K 59/80* (2023.01)
*H10K 59/122* (2023.01)

(52) U.S. Cl.
CPC ......... *H10K 59/873* (2023.02); *H10K 59/122* (2023.02)

(58) Field of Classification Search
CPC ............... H10K 59/873; H10K 59/122; H10K 50/8426; H10K 50/844; H10K 59/124; H10K 59/10–221; H10K 59/12–1315; H10K 50/00–88; H10K 71/00–861; H10D 30/6755; H10W 42/121
See application file for complete search history.

(56) References Cited

U.S. PATENT DOCUMENTS

| | | | | |
|---|---|---|---|---|
| 2021/0091320 A1* | 3/2021 | Choi | ..................... | G06F 1/1626 |
| 2021/0257433 A1* | 8/2021 | Bang | .................. | H10K 59/8722 |
| 2022/0165990 A1 | 5/2022 | Lee et al. | | |
| 2023/0131110 A1* | 4/2023 | Kwon | .................. | H10K 59/124 257/88 |

FOREIGN PATENT DOCUMENTS

| | | | | |
|---|---|---|---|---|
| KR | 20150078248 A | | 7/2015 | |
| KR | 20200060941 A | | 6/2020 | |
| KR | 20200082764 A | * | 7/2020 | ......... H10K 59/8731 |
| KR | 20210081990 A | | 7/2021 | |
| KR | 10-2022-0070769 A | | 5/2022 | |

* cited by examiner

*Primary Examiner* — Shahed Ahmed
(74) *Attorney, Agent, or Firm* — Fish & Richardson P.C.

(57) ABSTRACT

A display device includes a substrate divided into a display area and a non-display area, a planarization layer disposed over the substrate, a bank disposed over the planarization layer, a dam disposed over the substrate in the non-display area, a hydrogen adsorption layer configured to cover an upper portion and a side surface of the dam, and an encapsulation layer disposed over the planarization layer and an upper portion of the bank and having an organic film positioned inside the dam, thereby improving properties and reliability of an oxide thin-film transistor of a GIP circuit by blocking introduction of hydrogen into the oxide thin-film transistor.

18 Claims, 12 Drawing Sheets

DISPLAY DEVICE

CROSS-REFERENCE TO RELATED APPLICATION

This application claims the priority of Korean Patent Application No. 10-2022-0190724 filed on Dec. 30, 2022, which is hereby incorporated by reference in its entirety.

BACKGROUND

Field of the Disclosure

The present disclosure relates to a display device, and more particularly, to a display device using an oxide thin-film transistor.

Description of the Background

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

Among the various display devices, an organic light-emitting display device refers to a display device that autonomously emits light. Unlike a liquid crystal display device, the organic light-emitting display device does not require a separate light source and thus may be manufactured as a lightweight, thin display device. In addition, the organic light-emitting display device is advantageous in terms of power consumption because the organic light-emitting display device operates at a low voltage. Further, the organic light-emitting display device is adopted as a next-generation display device because the organic light-emitting display device is excellent in a color implementation, a response speed, a viewing angle, and a contrast ratio.

SUMMARY

Accordingly, the present disclosure is directed to a display device that substantially obviates one or more of problems due to limitations and disadvantages described above.

More specifically, the present disclosure is to provide a display device that uses an oxide thin-film transistor and improves reliability of a product.

The present disclosure is also to provide a display device that suppresses introduction of hydrogen into a gate-in-panel (GIP) oxide thin-film transistor.

The present disclosure is not limited to the above-mentioned, and other features, which are not mentioned above, may be clearly understood by those skilled in the art from the following descriptions.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes a substrate divided into a display area and a non-display area, a planarization layer disposed over the substrate, a bank disposed over the planarization layer, a dam disposed over the substrate in the non-display area, a hydrogen adsorption layer configured to cover an upper portion and a side surface of the dam and an encapsulation layer disposed over the planarization layer and an upper portion of the bank and having an organic film positioned inside the dam.

Other detailed matters of the exemplary aspects are included in the detailed description and the drawings.

According to the present disclosure, the hydrogen adsorption layer is applied to the upper portion and the side surface of the dam. Therefore, it is possible to improve the properties and reliability of the oxide thin-film transistor by blocking the introduction of hydrogen into the oxide thin-film transistor of the GIP circuit.

The present disclosure may reduce a bezel width by reducing the number of dams by controlling the spread of the organic film of the encapsulation layer by disposing an insulation layer having high spread properties at an upper side and disposing an insulation layer having low spread properties in a spread control area at a lower side.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
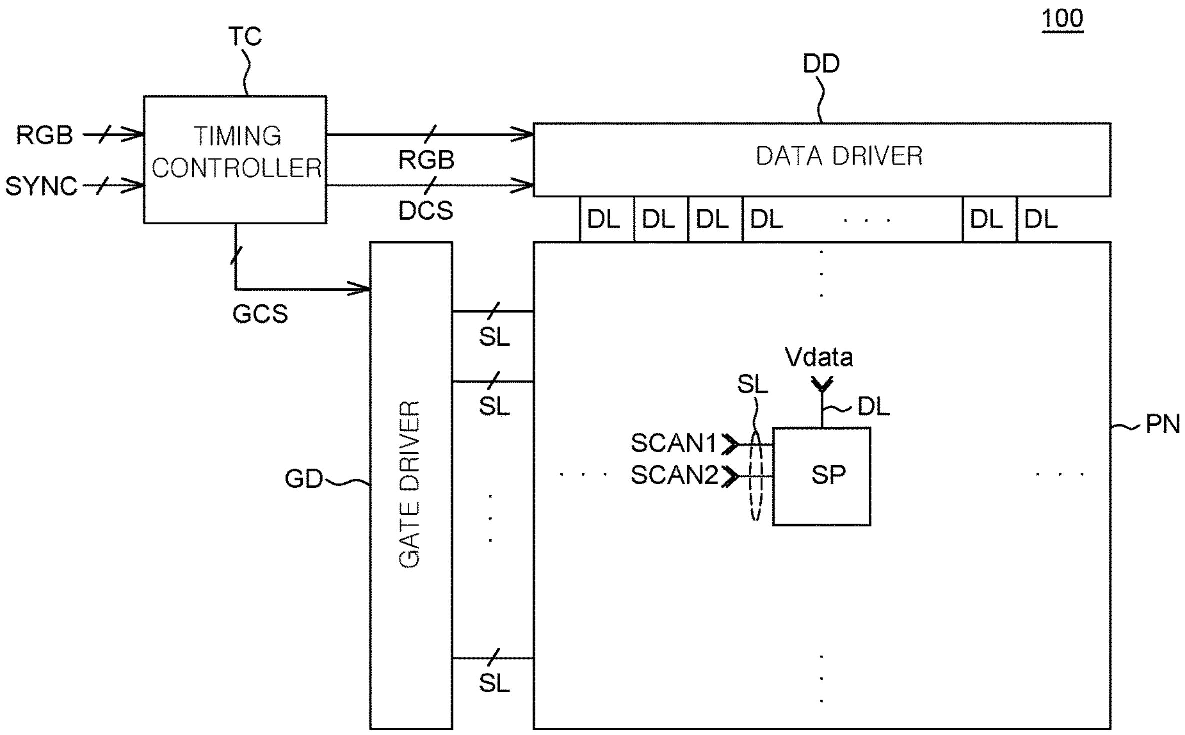
FIG. 1 is a schematic configuration view of a display device according to the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, exemplary aspects of the present disclosure will be described in detail with reference to accompanying drawings.

FIG. 1 is a schematic configuration view of a display device according to the present disclosure.

With reference to FIG. 1, a display device 100 may include a display panel PN including a plurality of subpixels SP, a gate driver GD and a data driver DD configured to supply various types of signals to the display panel PN, and a timing controller TC configured to control the gate driver GD and the data driver DD.

The gate driver GD may supply a plurality of scan signals to a plurality of scan lines SL in response to a plurality of gate control signals GCS provided from the timing controller TC. The plurality of scan signals may include a first scan signal SCAN1 and a second scan signal SCAN2.

The data driver DD may convert image data RGB, which are inputted from the timing controller TC in response to the plurality of data control signals DCS provided from the timing controller TC, into a data signal Vdata by using a reference gamma voltage. Further, the data driver DD may supply the converted data signal Vdata to a plurality of data lines DL.

The timing controller TC may align the image data RGB inputted from the outside and supply the aligned image data RGB to the data driver DD. The timing controller TC may create a gate control signal GCS and a data control signal DCS by using a synchronizing signal SYNC inputted from the outside.

Figure 2:
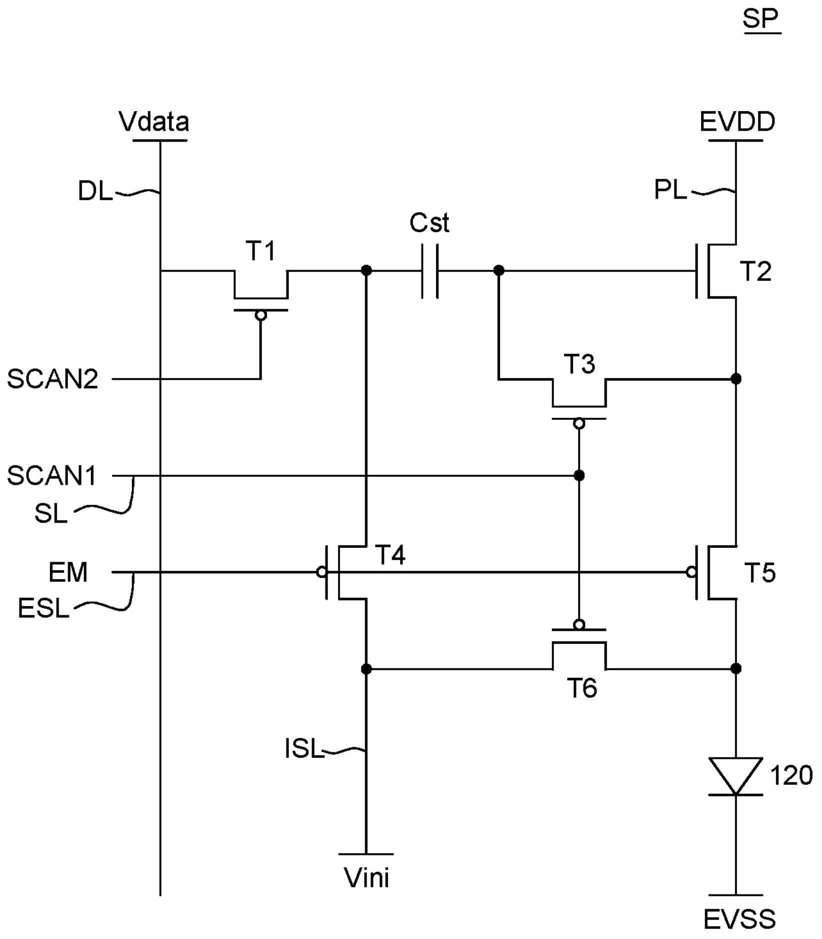
FIG. 2 is a circuit diagram of a subpixel of the display device in FIG. 1.

FIG. 2 is a circuit diagram of the subpixel of the display device in FIG. 1.

With reference to FIG. 2, the pixel circuit of each of the plurality of subpixels SP may include first to sixth transistors T1, T2, T3, T4, T5, and T6 and a capacitor Cst.

The first transistor T1 may be connected to a second scan line and controlled by the second scan signal SCAN2 supplied through the second scan line. The first transistor T1 may be electrically connected between the capacitor Cst and the data line for supplying the data signal Vdata.

The second transistor T2 may be electrically connected between the fifth transistor T5 and a high-potential power line to which a high-potential power signal EVDD is supplied. Further, a gate electrode of the second transistor T2 may be electrically connected to the capacitor Cst.

In addition, the third transistor T3 may be controlled by the first scan signal SCAN1 supplied through a first scan line. The third transistor T3 may compensate for a threshold voltage of the second transistor T2. The third transistor T3 may be referred to as a compensation transistor.

The fourth transistor T4 may be electrically connected to the capacitor Cst and an initialization signal line through which an initialization signal Vini is supplied. Further, the fourth transistor T4 may be controlled in response to a light emission control signal EM supplied through the light emission control signal line.

In addition, the fifth transistor T5 may be electrically connected between the second transistor T2 and a light emitting element 120. The fifth transistor T5 may be controlled in response to the light emission control signal EM supplied through the light emission control signal line.

The sixth transistor T6 may be electrically connected between an anode of the light emitting element 120 and the initialization signal line through which the initialization signal Vini is supplied. The sixth transistor T6 may be controlled in response to the first scan signal SCAN1 supplied through the first scan line.

The example has been described in which the pixel circuit of each of the plurality of subpixels SP includes the first to sixth transistors T1, T2, T3, T4, T5, and T6 and the capacitor Cst, as described above. However, the present disclosure is not limited thereto.

Hereinafter, a structure of a pixel of the display device 100 according to a first aspect of the present disclosure will be described in more detail with reference to FIGS. 3 and 6.

Figure 3:
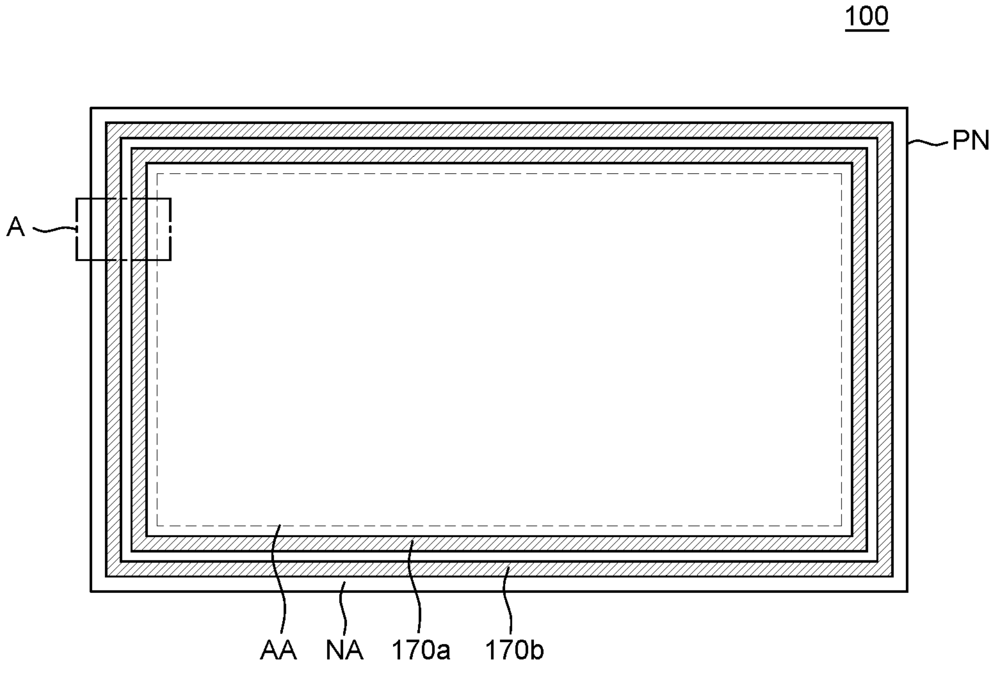
FIG. 3 is a top plan view of a display device according to a first aspect of the present disclosure.

FIG. 3 is a top plan view of the display device according to the first aspect of the present disclosure.

Figure 4:
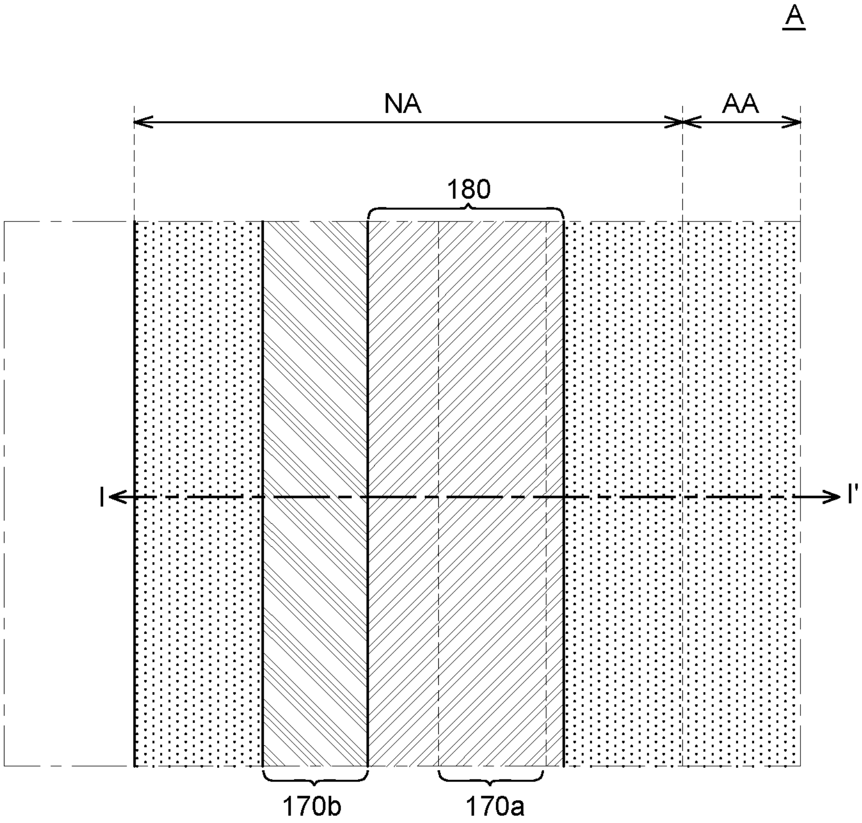
FIG. 4 is an enlarged view of part A in FIG. 3.

FIG. 4 is an enlarged view of part A in FIG. 3.

With reference to FIGS. 3 and 4, the display device 100 according to the first aspect of the present disclosure may include the display panel PN, a flexible film, and a printed circuit board.

The display panel PN is a panel configured to display images to a user.

The display panel PN may include a display element configured to display images, a driving element configured to operate the display element, and lines configured to transmit various types of signals to the display element and the driving element. Different display elements may be defined depending on the types of display panels PN. For example, in a case in which the display panel PN is an organic light-emitting display panel, the display element may be an organic light-emitting element including an anode, an organic layer, and a cathode.

Hereinafter, it is assumed that the display panel PN is the organic light-emitting display panel. However, the display panel PN is not limited to the organic light-emitting display panel.

The display panel PN may include a display area AA and a non-display area NA.

The display area AA is an area of the display panel PN in which images are displayed.

The display area AA may include a plurality of subpixels configured to constitute the plurality of pixels, and a circuit configured to operate the plurality of subpixels. The plurality of subpixels is minimum units that constitute the display area AA. The display element may be disposed in each of the plurality of subpixels. The plurality of subpixels may constitute the pixel. For example, the plurality of subpixels may each include the light-emitting element including the anode, the organic layer, and the cathode. However, the present disclosure is not limited thereto. In addition, the circuit configured to operate the plurality of subpixels may include driving elements, lines, and the like. For example, the circuit may include a thin-film transistor, a storage capacitor, a gate line, a data line, and the like. However, the present disclosure is not limited thereto.

The non-display area NA is an area in which no image is displayed.

FIG. 3 illustrates that the non-display area NA surrounds the display area AA having a quadrangular shape. However, the shapes and arrangements of the display area AA and the non-display area NA are not limited to the example illustrated in FIG. 3.

The display area AA and the non-display area NA may be suitable for the design of an electronic device equipped with the display device 100. For example, an exemplary shape of the display area AA may be a pentagonal shape, a hexagonal shape, a circular shape, an elliptical shape, or the like.

Various lines and circuits for operating the organic light-emitting element in the display area AA may be disposed in the non-display area NA. For example, the non-display area NA may include link lines for transmitting signals to the plurality of subpixels and the circuit in the display area AA. The non-display area NA may include a drive IC such as a gate driver IC and a data driver IC. However, the present disclosure is not limited thereto.

The left and right sides in FIG. 3 may be defined as gate pad parts on which the gate driver IC is disposed. The lower side in FIG. 3 may be defined as a data pad part connected to the flexible film. However, the present disclosure is not limited thereto.

The gate driver IC may be formed independently of the display panel PN and electrically connected to the display panel in various ways. However, the gate driver IC may be configured in a gate-in-panel (GIP) manner to be mounted in the display panel PN.

The display device 100 may include various additional elements configured to generate various signals or operate the pixel in the display area AA. The additional elements for operating the pixel may include an inverter circuit, a multiplexer, an electrostatic discharge (ESD) circuit, and the like. The display device 100 may also include additional elements related to functions other than the function of operating the pixel. For example, the display device 100 may include additional elements that provide a touch detection function, a user certification function (e.g., fingerprint recognition), a multi-level pressure detection function, a tactile feedback function, and the like. The additional elements may be positioned in the non-display area NA and/or an external circuit connected to a connection interface.

Although not illustrated, the flexible film is a film for supplying signals to the plurality of subpixels and the circuit in the display area AA. The flexible film may be electrically connected to the display panel PN. The flexible film is disposed at one end of the non-display area NA of the display panel PN. The flexible film may supply power voltage, data voltage, and the like to the plurality of subpixels and the circuit in the display area AA. For example, the drive IC such as the data driver IC may be disposed on the flexible film.

The printed circuit board may be disposed at one end of the flexible film and connected to the flexible film. The printed circuit board is a component configured to supply signals to the drive IC. The printed circuit board may supply the drive IC with various signals such as driving signals, data signals, and the like.

According to the present disclosure, it is possible to ensure excellent characteristics of the display panel PN by using an oxide thin-film transistor having high mobility and low leakage current (off-current) properties.

The use of the oxide thin-film transistor provides the advantages of requiring low electric power, ensuring the stability of the thin-film transistor, reducing costs, and facilitating a process of manufacturing the large-area display panel PN. In addition, in case that the GIP circuit is also manufactured by using the oxide thin-film transistor, the effect of reducing costs increases as the number of processes decreases. However, the initial properties of the oxide thin-film transistor may be changed by inside and outside hydrogen. Therefore, an effort needs to be made to block hydrogen and suppress moisture in the case of the GIP circuit disposed at an outermost periphery.

Therefore, the display device of the present disclosure may include an encapsulation layer configured to suppress the penetration of outside moisture or oxygen to protect the light-emitting element, which is vulnerable to moisture or oxygen, from outside moisture, oxygen, or the like.

The encapsulation layer may be configured as a single or a plurality of layers. For example, the encapsulation layer may include a primary protective film, an organic film, and a secondary protective film.

In addition, according to the present disclosure, one or more dams 170*a* and 170*b* may be disposed to inhibit the encapsulation layer from being collapsed.

The one or more dams 170*a* and 170*b* may be positioned on a boundary between the display area AA and the non-display area NA or positioned in the vicinity of the boundary. For example, the one or more dams 170*a* and 170*b* may be positioned at a point of the outer periphery that is directed inward and then suddenly raised. Alternatively, the one or more dams 170*a* and 170*b* may be positioned at a point that is directed downward along an inclined surface of the encapsulation layer and changed in a direction in which an inclination of the encapsulation layer becomes suddenly gentle or is raised again.

With reference to FIGS. 3 and 4, the one or more dams 170*a* and 170*b* may include a first dam 170*a* positioned inward, and a second dam 170*b* positioned outward.

The dams 170*a* and 170*b* may each have a frame shape that surrounds the display area AA. However, the present disclosure is not limited thereto. For example, the dams 170*a* and 170*b* may each have a quadrangular frame shape that surrounds the display area AA.

In addition, according to the present disclosure, a hydrogen adsorption layer 180 may be applied to upper portions and side surfaces of the dams 170*a* and 170*b* to protect the oxide thin-film transistor of the GIP circuit that is vulnerable to hydrogen. Therefore, it is possible to improve the properties and reliability of the oxide thin-film transistor by blocking the introduction of hydrogen into the oxide thin-film transistor of the GIP circuit. The hydrogen adsorption layer 180 may be made of a titanium (Ti)-based material having an excellent ability to trap hydrogen.

For example, the hydrogen adsorption layer 180 according to the first aspect of the present disclosure may be formed from an inner side surface of the second dam 170*b* to an inner side surface of the first dam 170*a*. However, the present disclosure is not limited thereto. In this case, the hydrogen adsorption layer 180 may completely cover the upper portion and the side surface of the first dam 170*a*.

The hydrogen adsorption layer 180 may have a frame shape that surrounds the display area AA. However, the present disclosure is not limited thereto. For example, the hydrogen adsorption layer 180 may have a quadrangular frame shape that surrounds the display area AA.

In case that the hydrogen adsorption layer 180 made of titanium (Ti) is disposed on the upper portions and the side surfaces of the dams 170*a* and 170*b*, it may be difficult to control a downward flow of the organic film of the encapsulation layer. Therefore, the present disclosure may reduce a bezel width by reducing the number of dams 170*a* and 170*b* by controlling the spread of the organic film of the encapsulation layer by disposing an insulation layer having high spread properties at an upper side and disposing an insulation layer having low spread properties in a spread control area at a lower side.

For example, the primary protective film of the encapsulation layer according to the first aspect of the present disclosure is configured as two layers. In this case, the silicon oxide (SiOx)-based insulation layer having high spread properties may be disposed at the upper side, and the silicon nitride (SiNx)-based insulation layer having low spread properties may be disposed to extend in the spread control area at the lower side.

Specific configurations of the hydrogen adsorption layer 180 and the encapsulation layer according to the first aspect of the present disclosure will be described in detail with reference to FIGS. 5 and 6.

Figure 5:
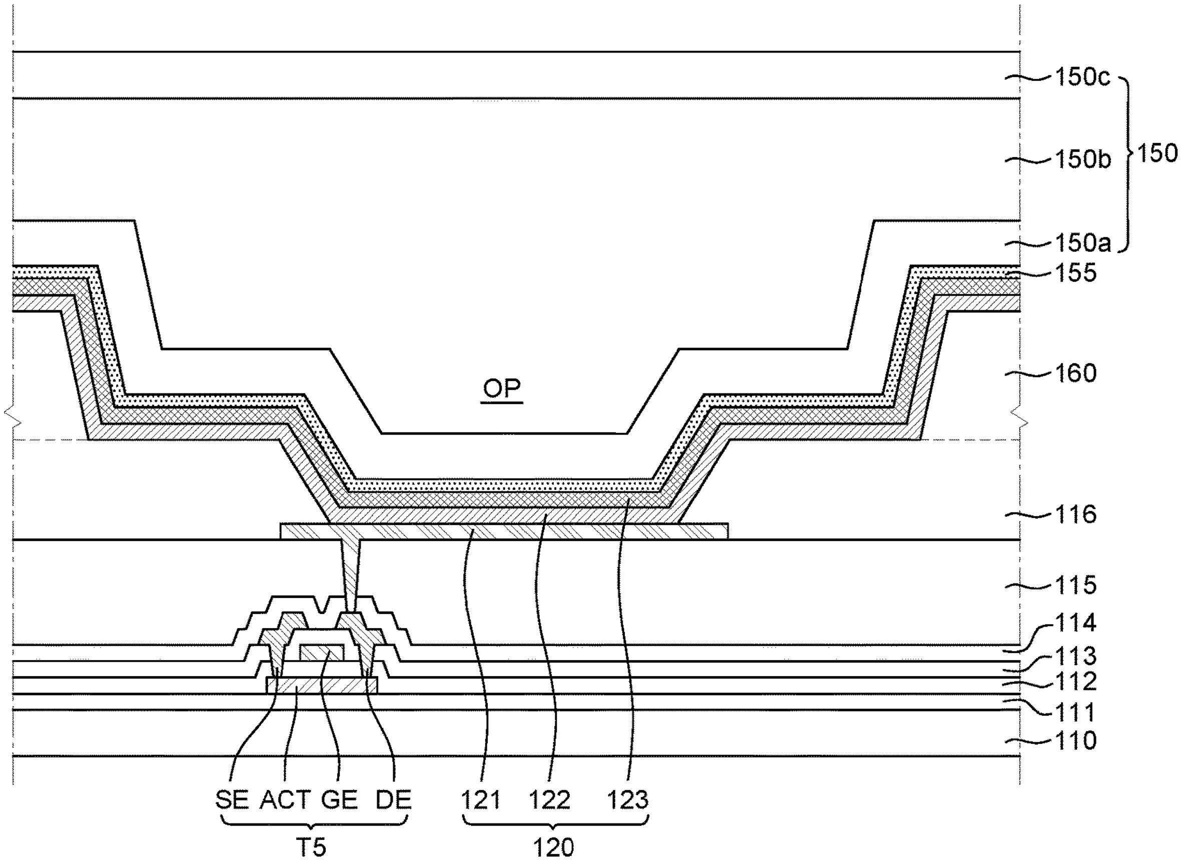
FIG. 5 is a view illustrating a cross-section of a single subpixel of the display device in FIG. 3.

FIG. 5 is a view illustrating a cross-section of a single subpixel of the display device in FIG. 3.

Figure 6:
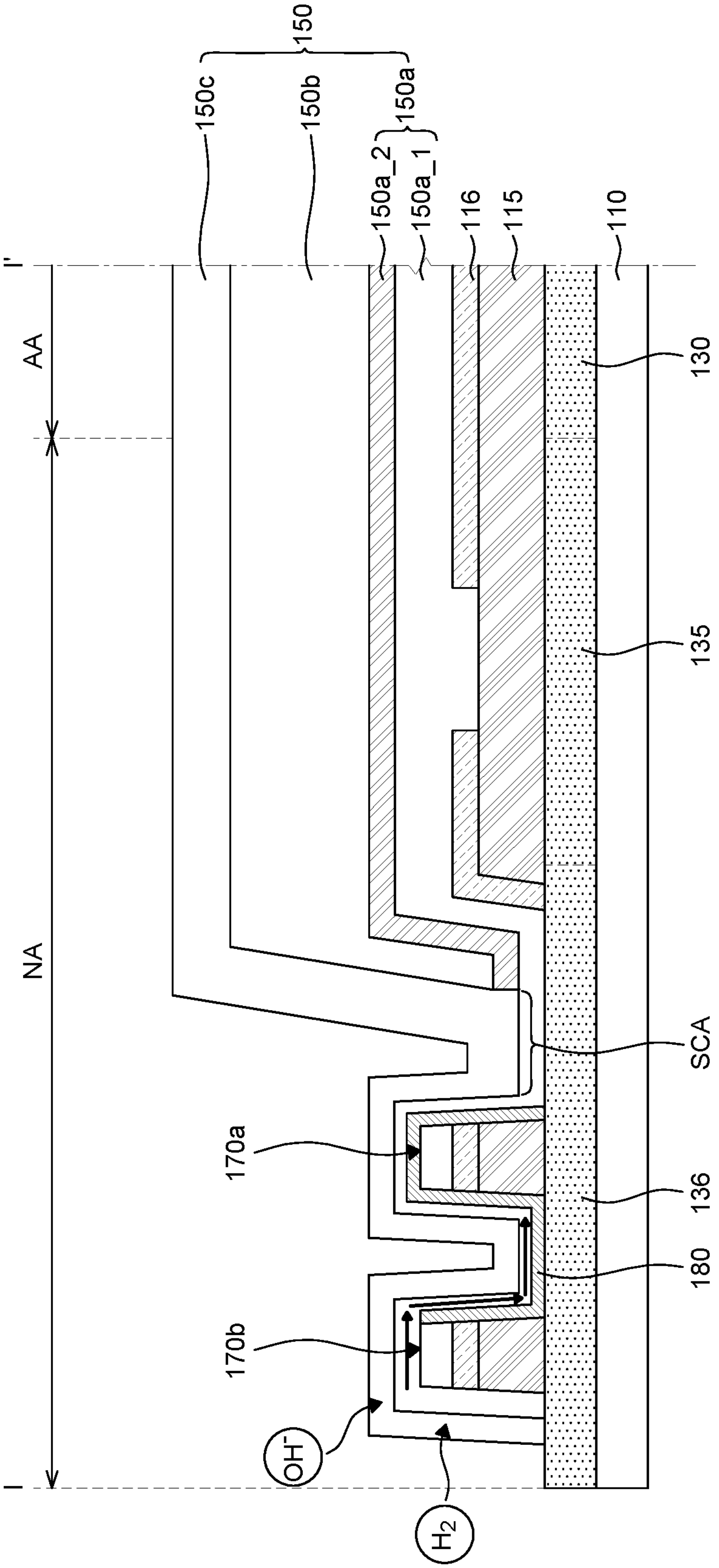
FIG. 6 is a view illustrating a cross-section taken along line I-I' in FIG. 4.

FIG. 6 is a view illustrating a cross-section taken along line I-I' in FIG. 4.

For convenience of description, FIG. 5 illustrates only the fifth transistor T5 among the plurality of capacitors and the plurality of transistors of the subpixel.

For convenience of description, FIG. 6 does not illustrate a pixel part 130 of the display area AA and a wiring part 136 and a GIP part 135 of the non-display area NA.

With reference to FIGS. 5 and 6, a substrate 110 may be a support member for supporting other components of the display device and may be made of an insulating material.

For example, the substrate 110 may be made of glass, resin, or the like. In addition, the substrate 110 may be made of plastic such as polymer or polyimide (PI) and made of a material having flexibility.

The substrate 110 may be divided into the display area AA and the non-display area NA.

The display area AA is an area in which images are displayed.

The display area AA may include the plurality of subpixels configured to constitute the plurality of pixels, and the circuit configured to operate the plurality of subpixels. The plurality of subpixels is minimum units that constitute the display area AA. The display element may be disposed in each of the plurality of subpixels. The plurality of subpixels may constitute the pixel. For example, the light-emitting element 120 including an anode 121, a plurality of organic layers 122, and a cathode 123 may be disposed on each of the subpixels. However, the present disclosure is not limited thereto. In addition, the circuit configured to operate the plurality of subpixels may include driving elements, lines, and the like. For example, the circuit may include the thin-film transistor T5, the storage capacitor, the gate line, the data line, and the like. However, the present disclosure is not limited thereto.

The non-display area NA is an area in which no image is displayed.

For example, various lines and circuits for operating the light-emitting element 120 in the display area AA may be disposed in the non-display area NA. For example, the non-display area NA may include link lines for transmitting signals to the subpixels and the circuit in the display area AA. The non-display area NA may include a drive IC such as a gate driver IC and a data driver IC. However, the present disclosure is not limited thereto.

The pixel part 130, the GIP part 135, and the wiring part 136 may be positioned on an upper portion of the substrate 110.

The pixel part 130 may be positioned in the display area AA. For example, the pixel part 130 may include a driving element and various types of lines or the like for operating the driving element. For example, the pixel part 130 may include the thin-film transistor T5, the storage capacitor, the gate line, the data line, and the like.

The GIP part 135 and the wiring part 136 may be positioned in the non-display area NA. For example, the GIP part 135 may include a GIP transistor, and various types of lines for operating the GIP transistor. For example, the wiring part 136 may include a low-potential voltage line.

A buffer layer 111 may be disposed on the substrate 110. The buffer layer 111 may reduce the penetration of moisture or impurities through the substrate 110. For example, the buffer layer 111 may be configured as a single layer or multilayer made of silicon oxide (SiOx) or silicon nitride (SiNx). However, the present disclosure is not limited thereto. However, the buffer layer 111 may be excluded in accordance with the type of substrate 110 or the type of transistor. However, the present disclosure is not limited thereto.

The fifth transistor T5 may be disposed on an upper portion of the buffer layer 111.

The fifth transistor T5 may include an active layer ACT, a gate electrode GE, a source electrode SE, and a drain electrode DE.

The active layer ACT may be made of a semiconductor material such as an oxide semiconductor, amorphous silicon, or polysilicon. However, the present disclosure is not limited thereto. In case that the active layer ACT is made of oxide semiconductor, the active layer ACT may include a channel area, a source area, and a drain area, and the source area and the drain area may be areas having conductivity. However, the present disclosure is not limited thereto.

A gate insulation layer 112 may be disposed on the active layer ACT.

The gate insulation layer 112 is an insulation layer for insulating the active layer ACT and the gate electrode GE. The gate insulation layer 112 may be configured as a single layer or multilayer made of silicon oxide (SiOx) or silicon nitride (SiNx). However, the present disclosure is not limited thereto.

The gate electrode GE may be disposed on the gate insulation layer 112.

The gate electrode GE may be made of an electrically conductive material, for example, copper (Cu), nickel (Ni), aluminum (Al), molybdenum (Mo), titanium (Ti), chromium (Cr), or an alloy thereof. However, the present disclosure is not limited thereto.

An interlayer insulation layer 113 may be disposed on the gate electrode GE.

For example, the interlayer insulation layer 113 may have contact holes through which the source electrode SE and the drain electrode DE are connected to the active layer ACT. The interlayer insulation layer 113 may be configured as a single layer or multilayer made of silicon oxide (SiOx) or silicon nitride (SiNx). However, the present disclosure is not limited thereto.

The source electrode SE and the drain electrode DE may be disposed on the interlayer insulation layer 113. In this case, the source electrode SE and the drain electrode DE, which are disposed to be spaced apart from each other, may be electrically connected to the active layer ACT. The source electrode SE and the drain electrode DE may each be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The high-potential power line and the data line may be disposed on the interlayer insulation layer 113. The high-potential power line and the data line may be disposed on the same layer as the source electrode SE and the drain electrode DE and made of the same electrically conductive material. However, the present disclosure is not limited thereto. For example, the high-potential power line and the data line may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

For example, a protective layer 114 may be disposed on the high-potential power line, the data line, the source electrode SE, and the drain electrode DE. In this case, the protective layer 114 is an insulation layer for protecting the components disposed below the protective layer 114.

For example, the protective layer 114 may be configured as a single layer or multilayer made of silicon oxide (SiOx) or silicon nitride (SiNx). However, the present disclosure is not limited thereto. In addition, the protective layer 114 may be excluded in accordance with the aspects.

A planarization layer 115 may be disposed on the protective layer 114.

The planarization layer 115 is an insulation layer for planarizing an upper portion of the substrate 110.

The planarization layer 115 may be made of an organic material. For example, the planarization layer 115 may be configured as a single layer or multilayer made of polyimide or photo acrylic. However, the present disclosure is not limited thereto.

The planarization layer 115 may partially extend to the non-display area NA.

For example, the planarization layer 115 may extend to the non-display area NA to cover the GIP part 135.

The plurality of light-emitting elements 120 may be provided on the planarization layer 115 and disposed on the plurality of subpixels. The light-emitting element 120 may include the anode 121, the organic layer 122, and the cathode 123. Meanwhile, the organic layer 122 may include an individual layer disposed in the light-emitting area, and a common layer disposed on the entire surface of the substrate 110 including the light-emitting area. However, the present disclosure is not limited thereto.

The anode 121 may be disposed on the planarization layer 115.

The anode 121 may be electrically connected to the fourth transistor and supplied with the drive current of the pixel circuit. Because the anode 121 supplies positive holes to the light-emitting layer, the anode 121 may be made of an electrically conductive material having a high work function. For example, the anode 121 may be made of a transparent electrically conductive material such as indium tin oxide (ITO) and indium zinc oxide (IZO). However, the present disclosure is not limited thereto.

Meanwhile, the display device may be implemented as a top emission type or a bottom emission type. In the case of the top emission type, a reflective layer, which is made of a metallic material, for example, a material such as aluminum (Al) or silver (Ag) that has excellent reflection efficiency, may be additionally provided at a lower side of the anode 121 so that the light emitted from the light-emitting layer is reflected by the anode 121 and then propagates upward, i. e., toward the cathode 123. On the contrary, in case that the display device is the bottom emission type, the anode 121 may be made of only a transparent electrically conductive material. Hereinafter, the description will be made on the assumption that the display device according to the first aspect of the present disclosure is the top emission type.

As described above, the light-emitting element 120 of the present disclosure may include the anode 121, the organic layer 122, and the cathode 123.

The organic layer 122 may be disposed between the anode 121 and the cathode 123.

The organic layer 122 is an area in which the light is emitted as electrons and positive holes supplied from the anode 121 and the cathode 123 are combined.

The organic layer 122 of the first aspect of the present disclosure may include the individual layers respectively disposed on the plurality of subpixels, and the common layer disposed on the plurality of subpixels in common. However, the present disclosure is not limited thereto.

That is, to improve quality and productivity of the organic light-emitting display device, there have been proposed structures of various elements for improving efficiency of the light-emitting element 120, increasing the lifespan, and reducing the power consumption.

Therefore, there has been proposed the structure of the light-emitting element 120 to which a single stack, i. e., a single light-emitting unit is applied. Further, there also has been proposed the light-emitting element 120 having a tandem structure that uses a plurality of stacks, for example, a stack of a plurality of light-emitting units to implement improved efficiency and lifespan properties.

In the case of the tandem structure, for example, the light-emitting element 120 having a two-stack structure using a stack of a first light-emitting unit and a second light-emitting unit, the light-emitting areas in which light is emitted by recombination of electrons and holes are positioned in the first light-emitting unit and the second light-emitting unit, respectively. As a result, light emitted from a first light-emitting layer in the first light-emitting unit and light emitted from a second light-emitting layer in the second light-emitting unit may generate reinforcement interference, thereby providing higher brightness in comparison with a light-emitting element having a single stack structure.

In addition, in the light-emitting element 120, a distance between the plurality of subpixels constituting one pixel decreases as the organic light-emitting display device has high resolution. Except for the light-emitting layer (emission layer (EML)), auxiliary organic layers, such as a hole injection layer (HIL), a hole transport layer (HTL), a charge generating layer (CGL), an electron injection layer (EIL), and an electron transport layer (ETL), are formed in the common layer by deposition using a common mask to correspond to all the plurality of subpixels. For example, the light-emitting layers in the plurality of subpixels for generating light beams with different wavelengths may be individually formed by deposition using a fine metal mask to correspond to the respective subpixels. However, the present specification is not limited thereto.

A bank 116 may be disposed on the anode 121 and the planarization layer 115. The bank 116 is an insulation layer disposed between the plurality of subpixels to divide the plurality of subpixels.

The bank 116 may include an opening portion OP that exposes a part of the anode 121. The bank 116 may be made of an organic insulating material disposed to cover an edge or an edge portion of the anode 121. For example, the bank 116 may be made of polyimide, acryl, or benzocyclobutene (BCB)-based resin. However, the present disclosure is not limited thereto.

The bank 116 may partially extend to the non-display area NA.

For example, the bank 116 may extend to the non-display area NA to cover a part of the GIP part 135.

For example, the bank 116 may extend to the non-display area NA to cover the planarization layer 115 extending to the non-display area NA.

At least one spacer 160 may be disposed on the bank 116.

The spacer 160 may be disposed on the bank 116 to maintain a predetermined distance from the deposition mask at the time of forming the light-emitting element 120. For example, the spacer 160 may maintain predetermined distances between the deposition mask and the bank 116 under the spacer 160 and between the anode 121 and the deposition mask, thereby suppressing damage caused by contact. The spacer 160 may have a width gradually decreasing upward, for example, have a tapered shape to minimize an area to be in contact with the deposition mask.

The organic layer 122 may be disposed on the anode 121 and the bank 116.

The organic layer 122 may include the individual layers respectively disposed on the plurality of subpixels, and the common layer disposed on the plurality of subpixels in common. For example, the light-emitting layer may be included as the individual layer. The light emitting layer is an organic layer for emitting light with a specific color, and the different light emitting layers may be disposed on the first subpixel, the second subpixel, and the third subpixel, respectively. However, the present disclosure is not limited thereto. The plurality of light emitting layers may be disposed on all the subpixels, respectively, to emit white light.

The common layer is an organic layer disposed to improve luminous efficiency of the light-emitting layer.

The common layer may be a single layer formed over the plurality of subpixels. For example, the common layer may be integrally formed by connecting the common layers disposed on the plurality of subpixels, respectively. For example, the common layer may include a positive hole injecting layer, a positive hole transporting layer, an electron transporting layer, an electron injecting layer, a charge generating layer, and the like. However, the present disclosure is not limited thereto.

The cathode 123 may be disposed on the organic layer 122.

Because the cathode 123 supplies electrons to the organic layer 122, the cathode 123 may be made of an electrically conductive material having a low work function. The cathode 123 may be configured as a single layer over the plurality of subpixels. For example, the cathodes 123 of the plurality of subpixels may be connected to and integrated with one another. For example, the cathode 123 may be made of an electrically transparent conductive material such as indium tin oxide (ITO) or indium zinc oxide (IZO) or made of an alloy of ytterbium (Yb). The cathode 123 may further include a metal doping layer. However, the present disclosure is not limited thereto. For example, the cathode 123 may be electrically connected to the low-potential power line and supplied with the low-potential power signal.

As described above, the buffer layer 111, the gate insulation layer 112, the interlayer insulation layer 113, and the protective layer 114 may be disposed on an outer peripheral portion of the display device and extend to the non-display area NA.

In addition, the planarization layer 115 and the bank 116 may extend to a part of the non-display area NA.

The bank 116 may be disposed to cover the planarization layer 115. However, the present disclosure is not limited thereto.

A capping layer 155 may be disposed on the upper portion of the substrate 110 on which the cathode 123 is disposed. The capping layer 155 may be made of an organic material such as polymer. However, the present disclosure is not limited thereto. The capping layer 155 may not be disposed, as necessary.

In the case of the top emission type, the capping layer 155 may have a particular refractive index and serve to collect light to improve emission of light. In the case of the bottom emission type, the capping layer 155 may serve as a buffer for the cathode 123 of the light-emitting element 120.

The capping layer 155 may serve as a single optical adjustment layer. It is possible to increase reflectance on the boundary between the capping layer 155 and the outside by adjusting a difference in refractive index between the capping layer 155 and the outside. Therefore, the capping layer 155 may improve a micro-cavity effect at a particular wavelength. For example, the capping layers 155 may have different thicknesses for the respective subpixels.

An encapsulation layer 150, which is configured as a multilayer, may be disposed on the capping layer 155.

The elements, such as the light-emitting elements 120, which use organic materials, are very vulnerable to gas in the atmosphere, particularly moisture or oxygen and have low durability against heat. Therefore, a thorough encapsulation process is required.

If an appropriate encapsulation process is not performed, a lifespan of the element may rapidly deteriorate, and a dark spot is formed in the element, which may cause a defective product. On the contrary, in case that an appropriate encapsulation process is applied during the process of manufacturing the element, it is possible to ensure reliability of the element and produce the high-quality element.

Typically, the encapsulation processes are broadly classified into two types of encapsulation processes.

One encapsulation process is a covering process of attaching a moisture absorbent (getter) into a cover made of glass or metal and attaching the cover to an element by using a bonding agent having water permeability. The other encapsulation process is a thin-film encapsulation process of stacking various types of layers and attaching the stack to the light-emitting element or depositing a film directly on the light-emitting element.

A film, which is used for the thin-film encapsulation process, is mainly made of materials having excellent oxygen blocking properties and water vapor blocking properties. For example, chemical vapor deposition (CVD), plasma enhanced chemical vapor deposition (PECVD), atom layer deposition (ALD), and the like may be used as the deposition.

The encapsulation layer 150 will be specifically described. The encapsulation layer 150, which is an encapsulation means, may be configured by disposing the capping layer 155 on the top surface of the substrate 110 having the light-emitting element 120, and sequentially disposing a primary protective film 150*a*, an organic film 150*b*, and a secondary protective film 150*c* on the capping layer 155. However, the number of inorganic and organic films constituting the encapsulation layer 150 is not limited thereto.

The primary protective film 150*a* is configured as an inorganic insulating film and thus does not have good stack coverage because of a level difference at a lower side thereof. However, the organic film 150*b* performs the planarization, such that the secondary protective film 150*c* is not affected by a level difference caused by a lower film. In addition, the organic film 150*b* made of polymer may have a sufficiently large thickness, thereby solving a problem of cracks caused by foreign substances.

The protective films disposed in multiple layers for sealing may be positioned on the entire surface of the substrate 110 including the secondary protective film 150*c* to be opposite to each other. A transparent adhesive agent having adhesive properties may be interposed between the encapsulation layer 150 and the protective film.

A polarizing plate may be attached onto the protective film to suppress the reflection of light introduced from the outside.

Meanwhile, in the first aspect of the present disclosure, the organic film 150*b* may be formed in an inkjet manner. Therefore, the plurality of dams 170*a* and 170*b* made of polymer may be provided in the non-display area NA of the outer peripheral portion to control a flow of the organic film 150*b*. In this case, the dams 170*a* and 170*b* may serve to block the penetration of moisture from the outside.

For example, the dams 170*a* and 170*b* may be positioned in the non-display area NA. For example, the dams 170*a* and 170*b* may be positioned at a point of the outer periphery that is directed inward and then suddenly raised. Alternatively, the dams 170*a* and 170*b* may be positioned at a point that is directed downward along the inclined surface of the encapsulation layer 150 and changed in a direction in which the inclination of the encapsulation layer 150 becomes suddenly gentle or is raised again.

With reference to FIG. 6, the dams 170*a* and 170*b* may include the first dam 170*a* positioned inward, and the second dam 170*b* positioned outward.

When the liquid organic film 150*b* is dropped on the display area AA, the dams 170*a* and 170*b* may inhibit the liquid organic film 150*b* from invading a pad area by being collapsed in a direction toward the non-display area NA.

One of or both the first and second dams 170*a* and 170*b* may have a single-layer or multilayer structure. The first dam 170*a* and/or the second dam 170*b* may be basically formed in a dam forming pattern. The dam forming pattern may have a large height than a touch pad disposed in the pad area.

For example, the dam forming pattern may be made of the same material as the planarization layer 115.

For example, the dam forming pattern may be made of the same material as the bank 116 disposed on the planarization layer 115 to separate the subpixels in the display area AA. In some instances, the dam forming pattern may be made of the same material as the spacer 160 or the like configured to maintain intervals between the layers. In this case, the dam forming pattern may be formed simultaneously with the planarization layer 115, the bank 116, and/or the spacer 160. Therefore, it is possible to form a dam structure without requiring a mask addition process and increasing costs.

According to the present disclosure, the hydrogen adsorption layer 180 may be applied to the upper portions and the side surfaces of the dams 170*a* and 170*b* to protect the oxide thin-film transistor of the GIP part 135 that is vulnerable to hydrogen ($H_2$). Therefore, it is possible to improve the properties and reliability of the oxide thin-film transistor by blocking the introduction of hydrogen into the oxide thin-film transistor of the GIP part 135. The hydrogen adsorption layer 180 may be made of a material such as titanium (Ti) that may absorb hydrogen.

The hydrogen adsorption layer 180 may be formed after the bank 116 and the spacer 160 are formed.

For reference, hydrogen is diffused and introduced into the oxide thin-film transistor, which may allow the oxide thin-film transistor to have conductivity. As a result, a white stripe defect may occur on an outer periphery of the display area AA.

Titanium (Ti) may be metal having a hydrogen adsorption ability and effectively block hydrogen.

For example, the material, which constitutes the hydrogen adsorption layer 180, may include at least one of scandium (Sc), vanadium (V), lead (Pd), niobium (Nb), zirconium (Zr), yttrium (Y), tantalum (Ta), cerium (Ce), lanthanum (La), samarium (Sm), uranium (U), and the like, which are excellent in hydrogen adsorption ability, in addition to titanium (Ti). For reference, TiH has better hydrogen solubility than AlH, NiH, AgH, CuH, and ZnH.

In the case of metal hydride, for example, hydride of titanium (Ti) is $TiH_{2.00}$, and this means that two hydrogen (H) atoms may be stored for each titanium (Ti) atom. It may be seen that $TiH_{2.00}$ is better in hydrogen adsorption ability as much as one million times than $AlH<2.5\times10^{-8}$ which is hydride of aluminum (Al). In addition, $TiH_{2.00}$ is better in hydrogen adsorption ability as much as one hundred thousand times than copper (Cu).

For example, the hydrogen adsorption layer 180 according to the first aspect of the present disclosure may be formed from the inner side surface of the second dam 170*b* to the inner side surface of the first dam 170*a*. However, the present disclosure is not limited thereto. In this case, the hydrogen adsorption layer 180 may completely cover the upper portion and the side surface of the first dam 170*a*.

The hydrogen adsorption layer 180 may block the introduction of outside moisture or hydrogen into the oxide thin-film transistor of the GIP part 135 or delay the introduction of moisture or hydrogen.

For example, in case that the hydrogen adsorption layer 180 is disposed on the upper portions and the side surfaces of the dams 170*a* and 170*b*, outside moisture or hydrogen cannot be introduced into the GIP part 135 without passing through the dams 170*a* and 170*b*, and a route for the moisture penetration or the hydrogen penetration is lengthened, thereby delaying the occurrence of damage to the oxide thin-film transistor of the GIP part 135.

Therefore, the present disclosure may improve the properties and reliability of the thin-film transistor by blocking the introduction of hydrogen into the oxide thin-film transistor.

In case that the hydrogen adsorption layer 180 made of titanium (Ti) is disposed on the upper portions and the side surfaces of the dams 170*a* and 170*b*, it may be difficult to control a downward flow of the organic film 150*b* of the encapsulation layer 150.

In this case, a deviation of the spread properties of the organic film 150*b* may occur because of surface roughness of the primary protective film 150*a* disposed below the organic film 150*b*. Therefore, it is possible to control the spread of the organic film 150*b*. Therefore, in the first aspect of the present disclosure, a second primary protective film 150*a*_2 made of silicon oxide (SiOx) having relatively high spread properties may be disposed at the upper side as the primary protective film 150*a* of the encapsulation layer 150, and a first primary protective film 150*a*_1 made of silicon nitride (SiNx) having relatively low spread properties may be disposed at the lower side in a spread control area SCA.

For example, the first primary protective film 150*a*_1 made of silicon nitride (SiNx) has a small number of protrusions on a surface thereof, such that root mean square roughness (Rq) thereof may be about 3.14. The first primary protective film 150*a*_1 is a bulk layer, such that the spread properties of the organic film 150*b* are low.

For example, the second primary protective film 150*a*_2 made of silicon oxide (SiOx) has a large number of protrusions on a surface thereof, such that root mean square roughness (Rq) thereof may be 10 or more. The second primary protective film 150*a*_2 is a buffer layer, such that the spread properties of the organic film 150*b* are high.

For example, because the first primary protective film 150*a*_1 is exposed in the spread control area SCA, the spread of the organic film 150*b* on the upper portion thereof may be controlled to the inside of the first dam 170*a*.

For example, the spread control area SCA may be defined from an inner side surface of the first dam 170*a* to one end of the first primary protective film 150*a*_1. However, the present disclosure is not limited thereto.

Therefore, the first primary protective film 150*a*_1 as well as the dams 170*a* and 170*b* may extend to one end of the non-display area NA. However, the second primary protective film 150*a*_2 and the organic film 150*b* may be disposed to a position before the dams 170*a* and 170*b*, such that the secondary protective film 150*c* may cover and protect the organic film 150*b*.

As described above, it is possible to reduce the bezel width by reducing the number of dams 170*a* and 170*b* by controlling the spread of the organic film 150*b*.

Meanwhile, the hydrogen adsorption layer 180 of the present disclosure may extend to the outside of the second dam 170*b* to more effectively block the introduction of outside moisture or hydrogen. This configuration will be described in detail with reference to the drawings.

Figure 7:
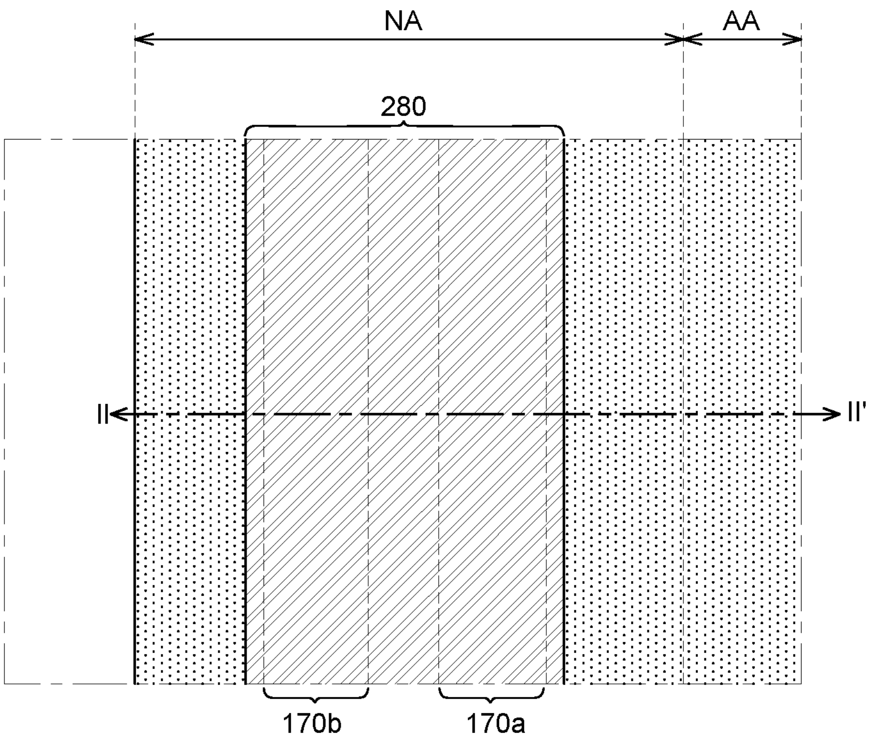
FIG. 7 is a top plan view illustrating a part of a display device according to a second aspect of the present disclosure.

FIG. 7 is a top plan view illustrating a part of a display device according to a second aspect of the present disclosure.

Figure 8:
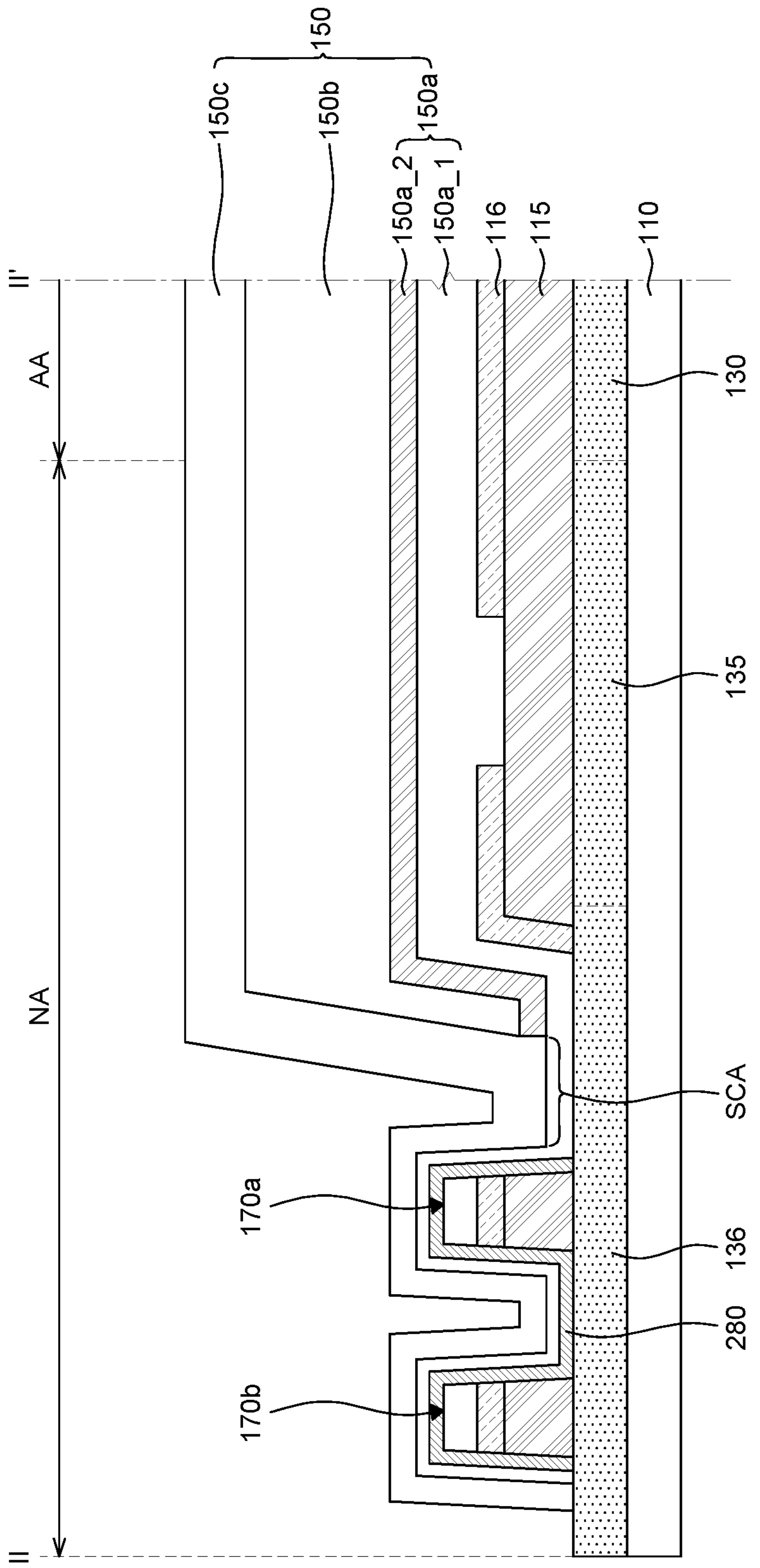
FIG. 8 is a view illustrating a cross-section taken along line II-II' in FIG. 7.

FIG. 8 is a view illustrating a cross-section taken along line II-II' in FIG. 7.

The display device according to the second aspect of the present disclosure in FIGS. 7 and 8 is substantially identical in configuration to the display device according to the first aspect in FIGS. 4 to 6, except for a configuration of a hydrogen adsorption layer 280. Therefore, repeated descriptions of the identical components will be omitted.

For convenience of description, FIG. 8 does not illustrate the pixel part 130 of the display area AA and the wiring part 136 and the GIP part 135 of the non-display area NA.

With reference to FIGS. 7 and 8, the substrate 110 may be divided into the display area AA and the non-display area NA.

The pixel part 130, the GIP part 135, and the wiring part 136 may be positioned on the upper portion of the substrate 110.

The pixel part 130 may be positioned in the display area AA. For example, the pixel part 130 may include the driving element and various types of lines or the like for operating the driving element. For example, the pixel part 130 may include the thin-film transistor, the storage capacitor, the gate line, the data line, and the like.

The GIP part 135 and the wiring part 136 may be positioned in the non-display area NA. For example, the GIP part 135 may include the GIP transistor, and various types of lines for operating the GIP transistor. For example, the wiring part 136 may include the low-potential voltage line.

Various types of insulation layers may be disposed on the upper portion of the substrate 110. For example, the buffer layer, the gate insulation layer, the interlayer insulation layer, the protective layer, and the planarization layer 115 may be disposed on the upper portion of the substrate 110.

As described above, the buffer layer, the gate insulation layer, the interlayer insulation layer, and the protective layer may be disposed on the outer peripheral portion of the display device and extend to the non-display area NA. However, the present disclosure is not limited thereto.

The planarization layer 115 may partially extend to the non-display area NA.

For example, the planarization layer 115 may extend to the non-display area NA to cover the GIP part 135.

The plurality of light-emitting elements may be provided on the planarization layer 115 and disposed on the plurality of subpixels. The light-emitting element may include the anode, the organic layer, and the cathode.

The bank 116 may be disposed on the anode and the planarization layer 115.

The bank 116 may partially extend to the non-display area NA.

For example, the bank 116 may extend to the non-display area NA to cover a part of the GIP part 135.

For example, the bank 116 may extend to the non-display area NA to cover the planarization layer 115 extending to the non-display area NA.

The at least one spacer may be disposed on the bank 116.

The encapsulation layer 150, which is configured as a multilayer, may be disposed on the upper portion of the bank 116.

For example, the encapsulation layer 150 may include the primary protective film 150*a*, the organic film 150*b* disposed on the primary protective film 150*a*, and the secondary protective film 150*c* disposed on the organic film 150*b*. However, the number of inorganic and organic films constituting the encapsulation layer 150 is not limited thereto.

For example, the dams 170*a* and 170*b* may be positioned in the non-display area NA. For example, the dams 170*a* and 170*b* may include the first dam 170*a* positioned inward, and the second dam 170*b* positioned outward.

According to the second aspect of the present disclosure, the hydrogen adsorption layer 280 may be disposed on the upper portions and the side surfaces of the dams 170*a* and

170*b*. The hydrogen adsorption layer 280 may be made of a material such as titanium (Ti) that may absorb hydrogen.

For example, the material, which constitutes the hydrogen adsorption layer 280, may include at least one of scandium (Sc), vanadium (V), lead (Pd), niobium (Nb), zirconium (Zr), yttrium (Y), tantalum (Ta), cerium (Ce), lanthanum (La), samarium (Sm), uranium (U), and the like, which are excellent in hydrogen adsorption ability, in addition to titanium (Ti).

For example, the hydrogen adsorption layer 280 according to the second aspect of the present disclosure may be formed from an outer side surface of the second dam 170*b* to the inner side surface of the first dam 170*a*. However, the present disclosure is not limited thereto. In this case, the hydrogen adsorption layer 280 may completely cover the upper portions and the side surfaces of the first and second dams 170*a* and 170*b*.

Therefore, it is possible to more effectively block the introduction of outside moisture or hydrogen into the oxide thin-film transistor of the GIP part 135 or delay the introduction of moisture or hydrogen.

In addition, as described above, the second primary protective film 150*a*_2 made of silicon oxide (SiOx) having high spread properties may be disposed at the upper side as the primary protective film 150*a* of the encapsulation layer 150, and the first primary protective film 150*a*_1 made of silicon nitride (SiNx) having low spread properties may be disposed at the lower side. In addition, the first primary protective film 150*a*_1 may extend to the spread control area SCA, such that the surface thereof may be exposed. For example, the spread control area SCA may be defined from the inner side surface of the first dam 170*a* to one end of the first primary protective film 150*a*_1. However, the present disclosure is not limited thereto.

For example, because the first primary protective film 150*a*_1 is exposed in the spread control area SCA, the spread of the organic film 150*b* on the upper portion thereof may be controlled to the inside of the first dam 170*a*.

Meanwhile, the hydrogen adsorption layer 280 of the present disclosure may extend to the side surface of the planarization layer 115 to more effectively block the introduction of outside moisture or hydrogen into the oxide thin-film transistor of the GIP part 135. This configuration will be described in detail with reference to the drawings.

Figure 9:
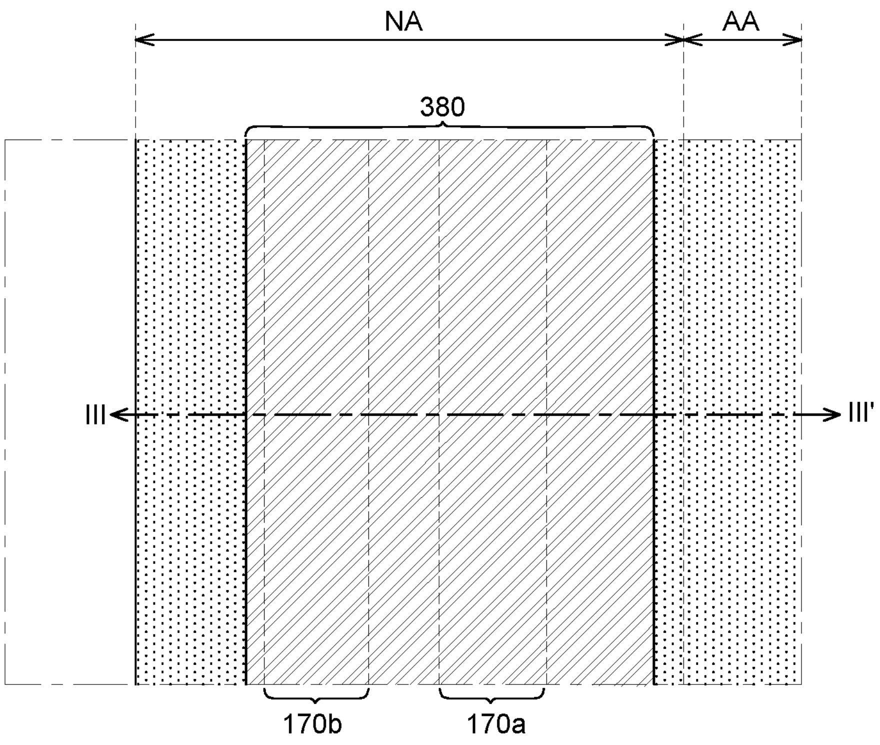
FIG. 9 is a top plan view illustrating a part of a display device according to a third aspect of the present disclosure.

FIG. 9 is a top plan view illustrating a part of a display device according to a third aspect of the present disclosure.

Figure 10:
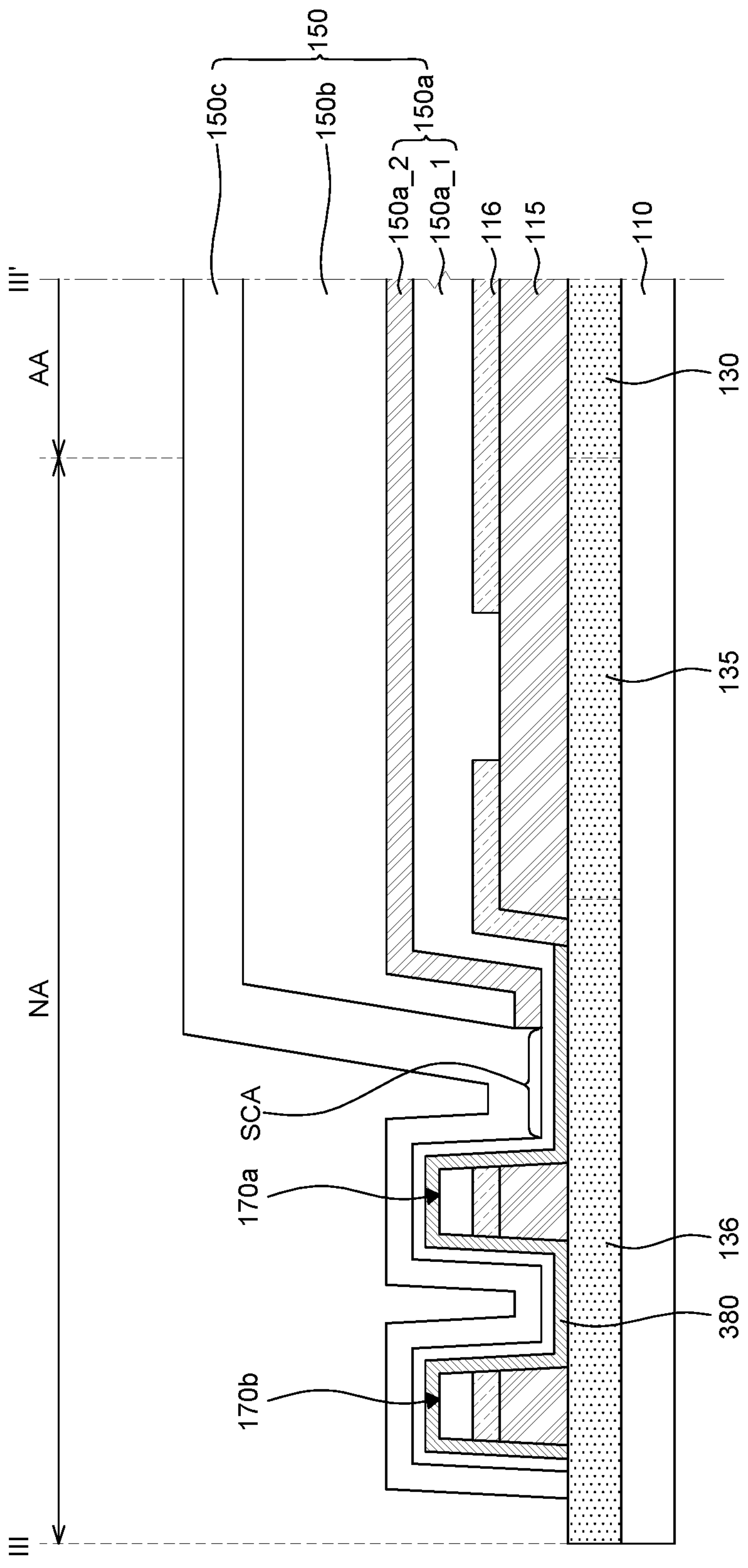
FIG. 10 is a view illustrating a cross-section taken along line III-III' in FIG. 9.

FIG. 10 is a view illustrating a cross-section taken along line III-III' in FIG. 9.

The display device according to the third aspect of the present disclosure in FIGS. 9 and 10 is substantially identical in configuration to the display device according to the second aspect in FIGS. 7 and 8, except for a configuration of a hydrogen adsorption layer 380. Therefore, repeated descriptions of the identical components will be omitted.

For convenience of description, FIG. 10 does not illustrate the pixel part 130 of the display area AA and the wiring part 136 and the GIP part 135 of the non-display area NA.

With reference to FIGS. 9 and 10, the substrate 110 may be divided into the display area AA and the non-display area NA.

The pixel part 130, the GIP part 135, and the wiring part 136 may be positioned on the upper portion of the substrate 110.

Various types of insulation layers may be disposed on the upper portion of the substrate 110. For example, the buffer layer, the gate insulation layer, the interlayer insulation layer, the protective layer, and the planarization layer 115 may be disposed on the upper portion of the substrate 110.

The planarization layer 115 may partially extend to the non-display area NA.

For example, the planarization layer 115 may extend to the non-display area NA to cover the GIP part 135.

The bank 116 may be disposed on the planarization layer 115.

The bank 116 may partially extend to the non-display area NA.

For example, the bank 116 may extend to the non-display area NA to cover a part of the GIP part 135. For example, the bank 116 may extend to the non-display area NA to cover the planarization layer 115 extending to the non-display area NA.

The encapsulation layer 150, which is configured as a multilayer, may be disposed on the upper portion of the bank 116.

For example, the encapsulation layer 150 may include the primary protective film 150*a*, the organic film 150*b* disposed on the primary protective film 150*a*, and the secondary protective film 150*c* disposed on the organic film 150*b*.

For example, the dams 170*a* and 170*b* may be positioned in the non-display area NA. For example, the dams 170*a* and 170*b* may include the first dam 170*a* positioned inward, and the second dam 170*b* positioned outward.

In this case, according to the third aspect of the present disclosure, the hydrogen adsorption layer 380 may be disposed on the upper portions and the side surfaces of the dams 170*a* and 170*b* and between the first and second dams 170*a* and 170*b*. In addition, the hydrogen adsorption layer 380 of the third aspect of the present disclosure may extend from the inner side surface of the first dam 170*a* to the side surface of the planarization layer 105. That is, for example, the hydrogen adsorption layer 380 of the third aspect of the present disclosure may be formed from the outer side surface of the second dam 170*b* to the side surface of the planarization layer 105. However, the present disclosure is not limited thereto. In this case, the hydrogen adsorption layer 380 may completely cover the upper portions and the side surfaces of the first and second dams 170*a* and 170*b* and the wiring part 136 from the outer side surface of the second dam 170*b* to the side surface of the planarization layer 105. Therefore, it is possible to more effectively block the introduction of outside moisture or hydrogen into the oxide thin-film transistor of the GIP part 135 or delay the introduction of moisture or hydrogen.

The hydrogen adsorption layer 380 may be made of a material such as titanium (Ti) that may absorb hydrogen.

For example, the material, which constitutes the hydrogen adsorption layer 380, may include scandium (Sc), vanadium (V), lead (Pd), niobium (Nb), zirconium (Zr), yttrium (Y), tantalum (Ta), cerium (Ce), lanthanum (La), samarium (Sm), uranium (U), and the like, which are excellent in hydrogen adsorption ability, in addition to titanium (Ti).

In addition, as described above, the second primary protective film 150*a*_2 made of silicon oxide (SiOx) having high spread properties may be disposed at the upper side as the primary protective film 150*a* of the encapsulation layer 150, and the first primary protective film 150*a*_1 made of silicon nitride (SiNx) having low spread properties may be disposed at the lower side. In addition, the first primary protective film 150*a*_1 may extend to the spread control area SCA, such that the surface thereof may be exposed. For example, the spread control area SCA may be defined from the inner side surface of the first dam 170*a* to one end of the first primary protective film 150_a__1. However, the present disclosure is not limited thereto.

For example, because the first primary protective film 150_a__1 is exposed in the spread control area SCA, the spread of the organic film 150_b_ on the upper portion thereof may be controlled to the inside of the first dam 170_a_.

According to the third aspect of the present disclosure, the first primary protective film 150_a__1 may extend to the non-display area NA to completely cover the hydrogen adsorption layer 380 disposed from the outer side surface of the second dam 170_b_ to the side surface of the planarization layer 105.

Meanwhile, the primary protective film 150_a_ of the present disclosure may extend to the outside of the dams 170_a_ and 170_b_, and a spread control layer may be formed on the primary protective film 150_a_ to control the spread of the organic film 150_b_ to the inside of the first dam 170_a_. This configuration will be described in detail with reference to the drawings.

Figure 11:
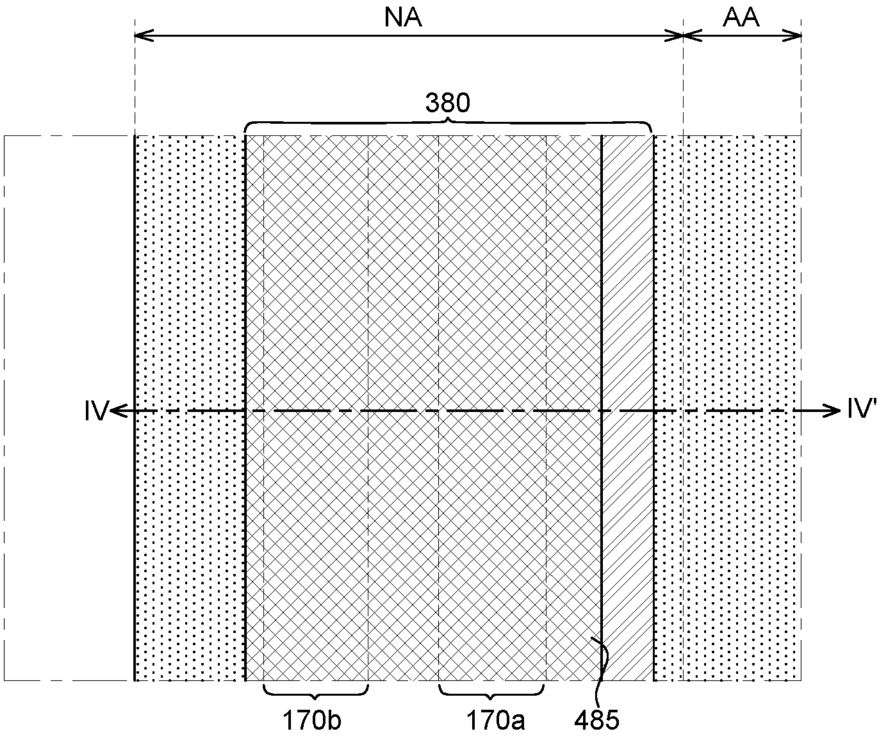
FIG. 11 is a top plan view illustrating a part of a display device of a fourth aspect of the present disclosure.

FIG. 11 is a top plan view illustrating a part of a display device of a fourth aspect of the present disclosure.

Figure 12:
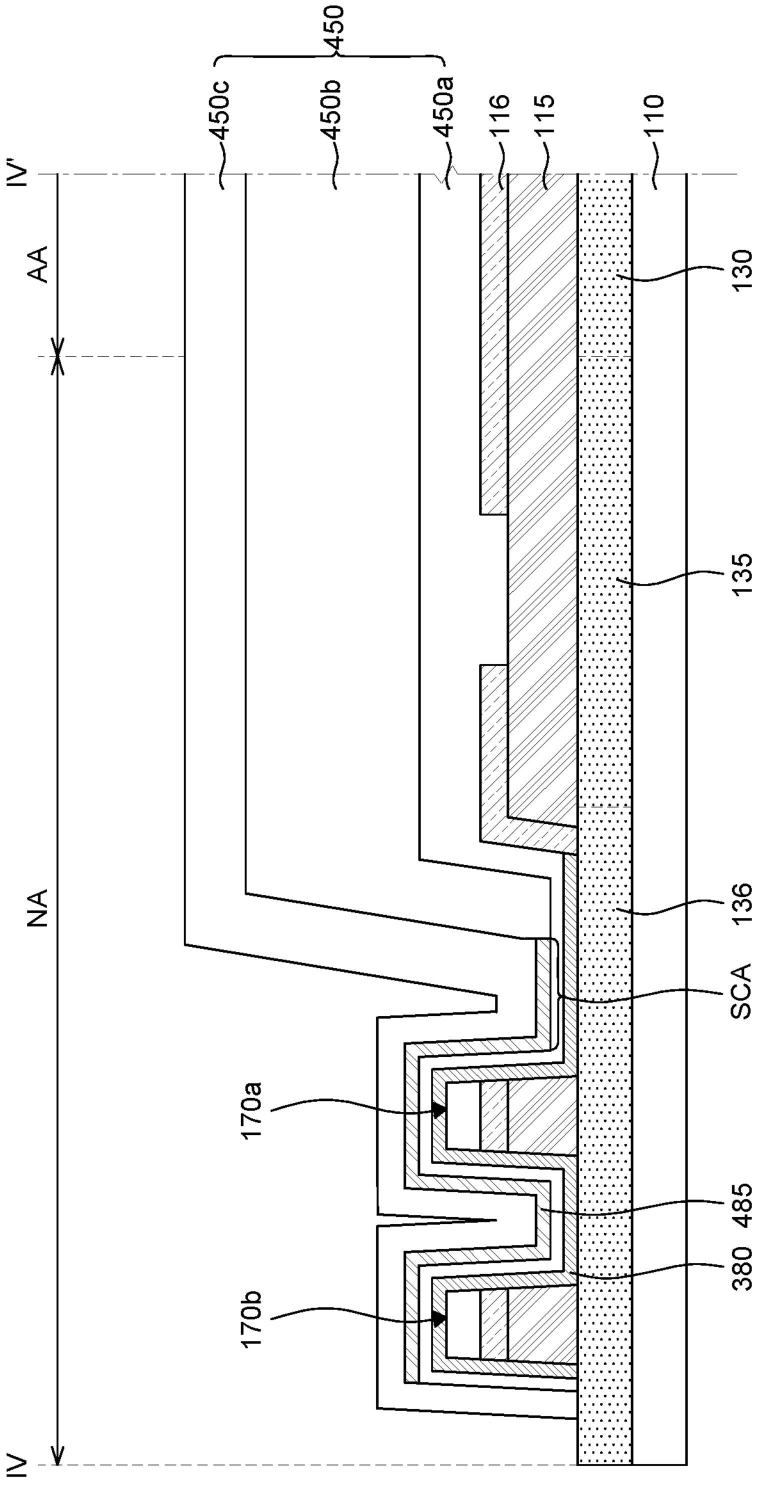
FIG. 12 is a view illustrating a cross-section taken along line IV-IV' in FIG. 11.

FIG. 12 is a view illustrating a cross-section taken along line IV-IV' in FIG. 11.

The display device according to the fourth aspect of the present disclosure in FIGS. 11 and 12 is substantially identical in configuration to the display device according to the third aspect in FIGS. 9 and 10, except for configurations of a spread control layer 485 and an encapsulation layer 450. Therefore, repeated descriptions of the identical components will be omitted.

For convenience of description, FIG. 12 does not illustrate the pixel part 130 of the display area AA and the wiring part 136 and the GIP part 135 of the non-display area NA.

With reference to FIGS. 11 and 12, the pixel part 130, the GIP part 135, and the wiring part 136 may be positioned on the upper portion of the substrate 110.

Various types of insulation layers may be disposed on the upper portion of the substrate 110. For example, the buffer layer, the gate insulation layer, the interlayer insulation layer, the protective layer, and the planarization layer 115 may be disposed on the upper portion of the substrate 110.

For example, the planarization layer 115 may extend to the non-display area NA to cover the GIP part 135.

The bank 116 may be disposed on the planarization layer 115.

For example, the bank 116 may extend to the non-display area NA to cover a part of the GIP part 135. For example, the bank 116 may extend to the non-display area NA to cover the planarization layer 115 extending to the non-display area NA.

The encapsulation layer 450, which is configured as a multilayer, may be disposed on the upper portion of the bank 116.

For example, the encapsulation layer 450 may include the primary protective film 450_a_, the organic film 450_b_ disposed on the primary protective film 450_a_, and the secondary protective film 450_c_ disposed on the organic film 450_b_.

For example, the dams 170_a_ and 170_b_ may be positioned in the non-display area NA. For example, the dams 170_a_ and 170_b_ may include the first dam 170_a_ positioned inward, and the second dam 170_b_ positioned outward.

In this case, according to the fourth aspect of the present disclosure, the hydrogen adsorption layer 380 may be disposed on the upper portions and the side surfaces of the dams 170_a_ and 170_b_ and between the first and second dams 170_a_ and 170_b_. In addition, the hydrogen adsorption layer 380 of the fourth aspect of the present disclosure may extend from the inner side surface of the first dam 170_a_ to the side surface of the planarization layer 105. That is, for example, the hydrogen adsorption layer 380 of the fourth aspect of the present disclosure may be formed from the outer side surface of the second dam 170_b_ to the side surface of the planarization layer 105. However, the present disclosure is not limited thereto. In this case, the hydrogen adsorption layer 380 may completely cover the upper portions and the side surfaces of the first and second dams 170_a_ and 170_b_ and the wiring part 136 from the outer side surface of the second dam 170_b_ to the side surface of the planarization layer 105.

The hydrogen adsorption layer 380 may be made of a material such as titanium (Ti) that may absorb hydrogen.

For example, the material, which constitutes the hydrogen adsorption layer 380, may include scandium (Sc), vanadium (V), lead (Pd), niobium (Nb), zirconium (Zr), yttrium (Y), tantalum (Ta), cerium (Ce), lanthanum (La), samarium (Sm), uranium (U), and the like, which are excellent in hydrogen adsorption ability, in addition to titanium (Ti).

According to the fourth aspect of the present disclosure, a primary protective film 450_a_ of the encapsulation layer 450 as well as the spread control area SCA and the dams 170_a_ and 170_b_ may extend to the non-display area NA. For example, the primary protective film 450_a_ may extend to the non-display area NA to cover the spread control area SCA and the dams 170_a_ and 170_b_.

According to the fourth aspect of the present disclosure, the spread control layer 485 may be formed on the primary protective film 450_a_ to control the spread of an organic film 450_b_ to the inside of the first dam 170_a_.

For example, the spread control layer 485 may extend from an upper portion of the second dam 170_b_ toward the inside of the first dam 170_a_. For example, the spread control layer 485 may cover the hydrogen adsorption layer 380, except for a part of the hydrogen adsorption layer 380.

For example, to control the spread of the organic film 450_b_ at the upper side to the inside of the first dam 170_a_, the spread control layer 485 may extend toward the planarization layer 115 to be spaced apart from the inner side surface of the first dam 170_a_ at a predetermined distance. Therefore, for example, one end of the organic film 450_b_ may contact one end of the spread control layer 485.

For example, because the spread control layer 485 has low surface roughness, the spread control layer 485 may be configured as an insulation layer made of silicon nitride (SiNx) having relatively low spread properties.

The spread control layer 485 may have a frame shape that surrounds the display area AA. However, the present disclosure is not limited thereto. For example, the spread control layer 485 may have a quadrangular frame shape that surrounds the display area AA.

According to the fourth aspect of the present disclosure, a secondary protective film 450_c_ may extend to the non-display area NA to completely cover the organic film 450_b_ and the spread control layer 485. For example, the secondary protective film 450_c_ may cover a side surface of the primary protective film 450_a_ exposed to the outside of the second dam 170_b_.

The exemplary aspects of the present disclosure may also be described as follows:

According to an aspect of the present disclosure, there is provided a display device. The display device comprises a substrate divided into a display area and a non-display area, a planarization layer disposed over the substrate, a bank disposed over the planarization layer, a dam disposed over the substrate in the non-display area, a hydrogen adsorption layer configured to cover an upper portion and a side surface of the dam and an encapsulation layer disposed over the planarization layer and an upper portion of the bank and having an organic film positioned inside the dam.

The dam may comprise a first dam positioned inward and a second dam positioned outward, and one of or both the first and second dams may be configured as a single-layer or multilayer structure.

The dam may have a frame shape that surrounds the display area.

The encapsulation layer may comprise a primary protective film disposed over the planarization layer and the upper portion of the bank, the organic film disposed on the primary protective film and a secondary protective film disposed on the organic film.

The hydrogen adsorption layer may be made of any one of titanium (Ti), scandium (Sc), vanadium (V), lead (Pd), niobium (Nb), zirconium (Zr), yttrium (Y), tantalum (Ta), cerium (Ce), lanthanum (La), samarium (Sm), and uranium (U).

The hydrogen adsorption layer may have a frame shape that surrounds the display area.

The primary protective film may comprise a first primary protective film made of silicon nitride (SiNx) and a second primary protective film disposed on the first primary protective film and made of silicon oxide (SiOx).

The hydrogen adsorption layer may be disposed from an inner side surface of the second dam to an inner side surface of the first dam.

The hydrogen adsorption layer may be disposed from an outer side surface of the second dam to an inner side surface of the first dam.

The hydrogen adsorption layer may be disposed from an outer side surface of the second dam to a side surface of the planarization layer.

The first primary protective film further may extend to the non-display area than the second primary protective film.

The second primary protective film and the organic film may be spaced apart from an inner side surface of the first dam.

The first primary protective film may extend to the non-display area to cover the dam and the hydrogen adsorption layer.

The first primary protective film may have lower surface roughness than the second primary protective film.

The organic film may be disposed on the second primary protective film and may not contact the first primary protective film.

The display device may further comprise a spread control layer disposed on the primary protective film.

The spread control layer may extend from an upper portion of the second dam toward the inside of the first dam.

The spread control layer may extend toward the planarization layer, and one end of the organic film may contact one end of the spread control layer.

The spread control layer may be configured as an insulation layer made of silicon nitride (SiNx).

A gate-in-panel (GIP) part may be positioned in the non-display area, and the GIP part may comprise an oxide thin-film transistor.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:

a substrate including a display area and a non-display area;

a planarization layer disposed over the substrate;

a bank disposed over the planarization layer;

a dam disposed over the substrate in the non-display area;

a hydrogen adsorption layer configured to cover an upper portion and a side surface of the dam; and an encapsulation layer disposed over the planarization layer and an upper portion of the bank and having an organic film positioned inside the dam, wherein the encapsulation layer comprises:

a primary protective film disposed over the planarization layer and the upper portion of the bank;

the organic film disposed on the primary protective film; and a secondary protective film disposed on the organic film, wherein the primary protective film comprises:

a first primary protective film made of silicon nitride (SiNx); and a second primary protective film disposed on the first primary protective film and made of silicon oxide (SiOx), wherein one end of the second primary protective film is disposed inside the dam, and wherein the first primary protective film is exposed in an area between the dam and the one end of the second primary protective film.

2. The display device of claim 1, wherein the dam comprises:

a first dam positioned inward; and a second dam positioned outward, and wherein at least one of the first and second dams is configured as a single-layer or multilayer structure.

3. The display device of claim 1, wherein the dam has a frame shape that surrounds the display area.

4. The display device of claim 1, wherein the hydrogen adsorption layer includes one of titanium (Ti), scandium (Sc), vanadium (V), lead (Pd), niobium (Nb), zirconium (Zr), yttrium (Y), tantalum (Ta), cerium (Ce), lanthanum (La), samarium (Sm), and uranium (U).

5. The display device of claim 1, wherein the hydrogen adsorption layer has a frame shape that surrounds the display area.

6. The display device of claim 1, wherein the hydrogen adsorption layer is disposed from an inner side surface of the second dam to an inner side surface of the first dam.

7. The display device of claim 1, wherein the hydrogen adsorption layer is disposed from an outer side surface of the second dam to an inner side surface of the first dam.

8. The display device of claim 1, wherein the hydrogen adsorption layer is disposed from an outer side surface of the second dam to a side surface of the planarization layer.

9. The display device of claim 1, wherein the first primary protective film further extends to the non-display area than the second primary protective film.

10. The display device of claim 1, wherein the second primary protective film and the organic film are spaced apart from an inner side surface of the first dam.

11. The display device of claim 1, wherein the first primary protective film extends to the non-display area to cover the dam and the hydrogen adsorption layer.

12. The display device of claim 1, wherein the first primary protective film has lower surface roughness than the second primary protective film.

13. The display device of claim 1, wherein the organic film is disposed on the second primary protective film and does not contact the first primary protective film.

14. The display device of claim 1, wherein a gate-in-panel (GIP) part is positioned in the non-display area, and the GIP part comprises an oxide thin-film transistor.

15. A display device comprising:

a substrate including a display area and a non-display area;

a planarization layer disposed over the substrate;

a bank disposed over the planarization layer;

a dam disposed over the substrate in the non-display area;

a hydrogen adsorption layer configured to cover an upper portion and a side surface of the dam;

an encapsulation layer disposed over the planarization layer and an upper portion of the bank and having an organic film positioned inside the dam; and a spread control layer, wherein the encapsulation layer comprises:

a primary protective film disposed over the planarization layer and the upper portion of the bank;

the organic film disposed on the primary protective film; and a secondary protective film disposed on the organic film, wherein the primary protective film comprises:

a first primary protective film made of silicon nitride (SiNx); and a second primary protective film disposed on the first primary protective film and made of silicon oxide (SiOx), and wherein the spread control layer is disposed on the primary protective film.

16. The display device of claim 15, wherein the spread control layer extends from an upper portion of the second dam toward the inside of the first dam.

17. The display device of claim 16, wherein the spread control layer extends toward the planarization layer, and one end of the organic film contacts one end of the spread control layer.

18. The display device of claim 16, wherein the spread control layer is configured as an insulation layer made of silicon nitride (SiNx).

* * * * *